United States Patent
Kong et al.

(10) Patent No.: US 12,549,146 B2
(45) Date of Patent: Feb. 10, 2026

(54) BIDIRECTIONAL AMPLIFIER INCLUDING MATCHING CIRCUITS HAVING SYMMETRICAL STRUCTURE AND COMMUNICATION DEVICE INCLUDING THE SAME

(71) Applicant: ELECTRONICS AND TELECOMMUNICATIONS RESEARCH INSTITUTE, Daejeon (KR)

(72) Inventors: Sunwoo Kong, Daejeon (KR); Bong Hyuk Park, Daejeon (KR); Hui Dong Lee, Daejeon (KR); Seunghyun Jang, Daejeon (KR); Seok Bong Hyun, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 646 days.

(21) Appl. No.: 17/964,157

(22) Filed: Oct. 12, 2022

(65) Prior Publication Data

US 2023/0198485 A1    Jun. 22, 2023

(30) Foreign Application Priority Data

Dec. 20, 2021    (KR) .................. 10-2021-0183157

(51) Int. Cl.
*H03F 3/38*    (2006.01)
*H03F 3/62*    (2006.01)
*H04B 1/40*    (2015.01)

(52) U.S. Cl.
CPC .................. *H03F 3/62* (2013.01); *H04B 1/40* (2013.01); *H03F 2200/534* (2013.01)

(58) Field of Classification Search
CPC .................. H03F 3/62; H03F 2200/222; H03F 2200/387; H03F 2200/451;
(Continued)

(56) References Cited

U.S. PATENT DOCUMENTS 3,855,431 A * 12/1974 Stewart .................... H04B 3/36
379/344
3,889,072 A * 6/1975 Stewart .................... H04M 3/40
379/406.01
(Continued)

FOREIGN PATENT DOCUMENTS

KR          101070756 B1    10/2011
KR          20160118555 A   10/2016
(Continued)

*Primary Examiner* — Khanh V Nguyen
(74) *Attorney, Agent, or Firm* — Rabin & Berdo, P.C.

(57) ABSTRACT

Disclosed is a bidirectional amplifier. The bidirectional amplifier includes a first matching circuit, a second matching circuit, an amplifier circuit connected between the first matching circuit and the second matching circuit, that amplifies a first input signal received from the first matching circuit to output the amplified first input signal to the second matching circuit, and that amplifies a second input signal received from the second matching circuit to output the amplified first input signal to the first matching circuit, and the first and second matching circuits have a symmetrical structure and operate complementary to each other.

12 Claims, 7 Drawing Sheets

(58) Field of Classification Search
CPC ......... H03F 2200/534; H03F 2200/541; H03F 1/0261; H03F 1/565; H03F 3/193; H03F 3/245; H03F 1/0211; H03F 1/56; H03F 3/191; H04B 1/40; H03H 7/38
See application file for complete search history.

(56) References Cited

U.S. PATENT DOCUMENTS

| | | | |
|---|---|---|---|
| 7,239,852 B2* | 7/2007 | Yang | H03F 3/193 |
| | | | 455/127.1 |
| 11,152,905 B2 | 10/2021 | Hu et al. | |
| 11,228,337 B2 | 1/2022 | Yoo et al. | |
| 11,296,659 B2* | 4/2022 | Gong | H03F 3/45085 |
| 2006/0205342 A1* | 9/2006 | McKay, Sr. | H04B 3/36 |
| | | | 455/11.1 |
| 2010/0086310 A1 | 4/2010 | Lee et al. | |
| 2011/0052125 A1 | 3/2011 | Lee et al. | |
| 2011/0267144 A1 | 11/2011 | Behera et al. | |
| 2016/0072447 A1 | 3/2016 | Seth et al. | |
| 2021/0328619 A1 | 10/2021 | Sun et al. | |

FOREIGN PATENT DOCUMENTS

| | | |
|---|---|---|
| KR | 20200072788 A | 6/2020 |
| KR | 10-2021-0119042 A | 10/2021 |

* cited by examiner

BIDIRECTIONAL AMPLIFIER INCLUDING MATCHING CIRCUITS HAVING SYMMETRICAL STRUCTURE AND COMMUNICATION DEVICE INCLUDING THE SAME

CROSS-REFERENCE TO RELATED APPLICATIONS

This application claims priority under 35 U.S.C. § 119 to Korean Patent Application No. 10-2021-0183157, filed on Dec. 20, 2021, in the Korean Intellectual Property Office, the disclosures of which are incorporated by reference herein in their entireties.

BACKGROUND

Embodiments of the present disclosure described herein relate to a bidirectional amplifier, and more particularly, relate to a bidirectional amplifier including matching circuits having a symmetrical structure and a communication device including the same.

When matching between components in wireless communication devices is not performed, the high-frequency signal may be attenuated due to reflection between the components. To compensate for the attenuation of the high-frequency signal, it is necessary to amplify the high-frequency signal. For example, the communication devices may amplify the high-frequency signal through a bidirectional amplifier. When the communication device transmits a signal, the bidirectional amplifier may amplify and output the amplitude of the high-frequency signal. In addition, when the communication device receives a signal, the bidirectional amplifier may amplify the received high-frequency signal.

In the bidirectional amplifier, a direction of amplification of a signal may be changed depending on a transmission mode or a reception mode. For example, a terminal operating as an output terminal in the transmission mode may operate as an input terminal when operating in a reception mode. Accordingly, a bidirectional amplifier that configures a matching circuit for low noise at the input terminal and configures a matching circuit for power amplification at the output terminal may be required regardless of the signal amplification direction.

SUMMARY

Embodiments of the present disclosure provide a bidirectional amplifier including matching circuits having a symmetrical structure and a communication device including the same.

According to an embodiment of the present disclosure, a bidirectional amplifier includes a first matching circuit, a second matching circuit, an amplifier circuit connected between the first matching circuit and the second matching circuit, that amplifies a first input signal received from the first matching circuit to output the amplified first input signal to the second matching circuit, and that amplifies a second input signal received from the second matching circuit to output the amplified first input signal to the first matching circuit, and the first and second matching circuits have a symmetrical structure and operate complementary to each other.

According to an embodiment, the amplifier circuit may include a first transistor, a second transistor, a third transistor having a gate node connected to a drain node of the first transistor and having a source node connected to a gate node of the first transistor, and a fourth transistor having a gate node connected to a drain node of the second transistor and having a source node connected to a gate node of the second transistor, the first matching circuit may include a first main inductor connected between a first node and a ground node providing a ground power, a first inductor connected between the gate node of the first transistor and the gate node of the second transistor, and a second inductor connected between a source node of the first transistor and a source node of the second transistor, and the second matching circuit may include a second main inductor connected between a second node and the ground node, a third inductor connected between a drain node of the third transistor and a drain node of the fourth transistor, and a fourth inductor connected between the gate node of the third transistor and the gate node of the fourth transistor.

According to an embodiment, the first inductor may have a negative mutual inductance with respect to the second inductor, and the third inductor may have a negative mutual inductance with respect to the fourth inductor.

According to an embodiment, the bidirectional amplifier may further include a first bias circuit that provides a first bias signal to the first inductor and provides a first power supply signal to the second inductor, and a second bias circuit that provides a second bias signal to the third inductor and provides a second power supply signal to the fourth inductor.

According to an embodiment, the first bias circuit may include a first switch that provides a first bias voltage as the first bias signal during a first mode, and a second switch that provides a ground voltage as the first power supply signal during the first mode, and the second bias circuit may include a third switch that provides a second bias voltage as the second bias signal during the first mode, and a fourth switch that provides a power supply voltage as the second power supply signal during the first mode.

According to an embodiment, the first mode may be a mode for amplifying the first input signal received from the first matching circuit and outputting the amplified first input signal to the second matching circuit.

According to an embodiment, the first bias circuit may include the first bias circuit may include a first switch that provides a second bias voltage as the first bias signal during a second mode, and a second switch that provides a power supply voltage as the first power supply signal during the second mode, and the second bias circuit may include a third switch that provides a first bias voltage as the second bias signal during the second mode, and a fourth switch that provides a ground voltage as the second power supply signal during the second mode.

According to an embodiment, the second mode may be a mode for amplifying the second input signal received from the second matching circuit and outputting the amplified second input signal to the first matching circuit.

According to an embodiment, the first matching circuit may generate the first input signal based on an operation signal received from a processor, and may provide the second input signal amplified by the amplifier circuit to the processor, and the second matching circuit may generate the second input signal based on a communication signal received from an antenna, and may provide the first input signal amplified by the amplifier circuit to the antenna.

According to an embodiment of the present disclosure, a communication device includes a processor, a signal controller that generates a control signal and a complementary control signal under a control of the processor, and a bidirectional amplifier that communicates with the processor and the signal controller, and the bidirectional amplifier includes a first matching circuit, a second matching circuit, an amplifier circuit connected between the first matching circuit and the second matching circuit, that amplifies a first input signal received from the first matching circuit to output the amplified first input signal to the second matching circuit and amplifies a second input signal received from the second matching circuit to output the amplified first input signal to the first matching circuit, and the first and second matching circuits have a symmetrical structure and operate complementary to each other.

According to an embodiment, the amplifier circuit may include a first transistor, a second transistor, a third transistor having a gate node connected to a drain node of the first transistor and having a source node connected to a gate node of the first transistor, and a fourth transistor having a gate node connected to a drain node of the second transistor and having a source node connected to a gate node of the second transistor, the first matching circuit may include a first main inductor connected between a first node and a ground node providing a ground power, a first inductor connected between the gate node of the first transistor and the gate node of the second transistor, and a second inductor connected between a source node of the first transistor and a source node of the second transistor, and the second matching circuit may include a second main inductor connected between a second node and the ground node, a third inductor connected between a drain node of the third transistor and a drain node of the fourth transistor, and a fourth inductor connected between the gate node of the third transistor and the gate node of the fourth transistor.

According to an embodiment, the communication device may further include a first bias circuit that provides a first bias signal to the first inductor and provides a first power supply signal to the second inductor, and a second bias circuit that provides a second bias signal to the third inductor and provides a second power supply signal to the fourth inductor.

According to an embodiment, the signal controller under the control of the processor may provide a control signal to the first bias circuit and may provide a complementary control signal to the second bias circuit, during the first mode, and may provide the complementary control signal to the first bias circuit and may provide the control signal to the second bias circuit, during a second mode different from the first mode.

According to an embodiment, the first mode may be a mode for amplifying the first input signal received from the first matching circuit and outputting the amplified first input signal to the second matching circuit, and the second mode may be a mode for amplifying the second input signal received from the second matching circuit and outputting the amplified second input signal to the first matching circuit.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1:
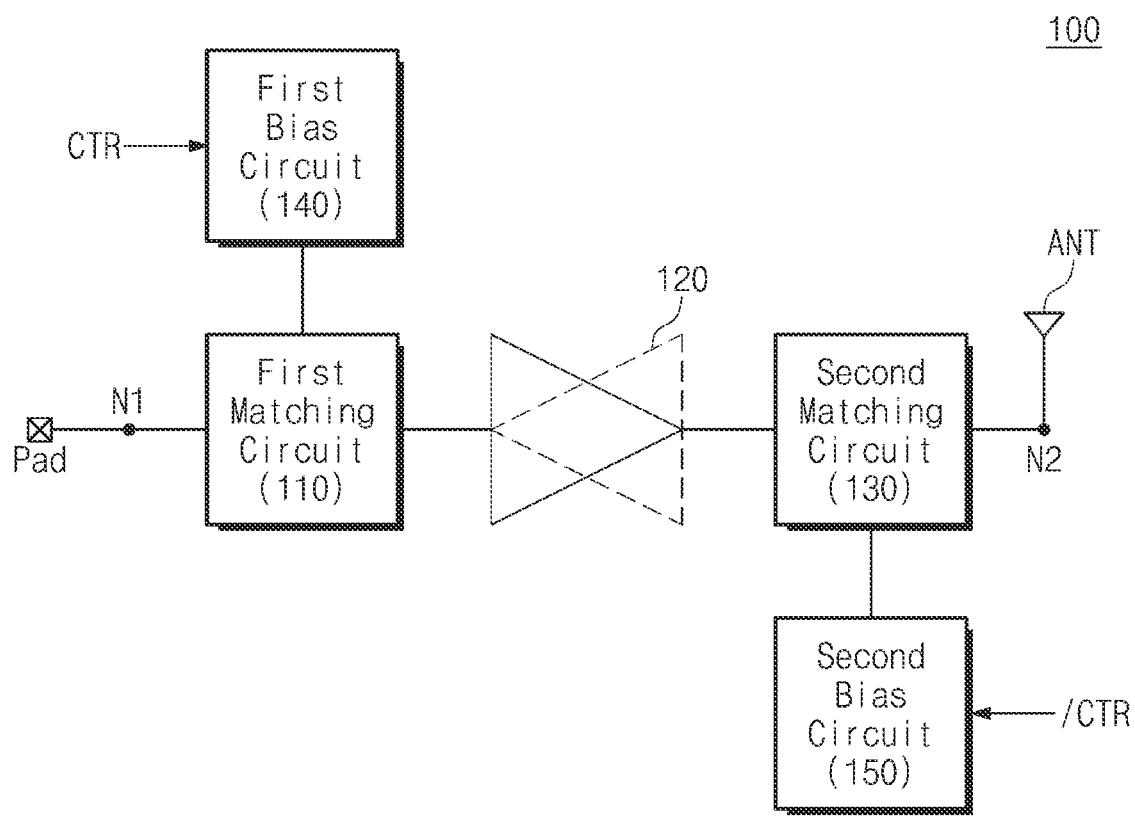
FIG. 1 is a block diagram of a bidirectional amplifier, according to an embodiment of the present disclosure.

Hereinafter, embodiments of the present disclosure will be described clearly and in detail such that those skilled in the art may easily carry out the present disclosure. In describing the present disclosure, to facilitate an overall understanding, like reference numerals are used for similar components in the drawings, and duplicate descriptions of similar components are omitted to avoid redundancy.

FIG. 1 is a block diagram of a bidirectional amplifier, according to an embodiment of the present disclosure. Referring to FIG. 1, a bidirectional amplifier 100 may include a first matching circuit 110, an amplifier circuit 120, a second matching circuit 130, a first bias circuit 140, and a second bias circuit 150. In some embodiments, the bidirectional amplifier 100 may be used in a terahertz band beamforming system.

In some embodiments, the bidirectional amplifier 100 may operate in a transmission mode. The transmission mode may be a mode in which a first input signal received from the first matching circuit 110 is amplified and the amplified first input signal is output to the second matching circuit 130. For example, when operating in the transmission mode, the first matching circuit 110 may receive an operation signal from a pad Tad' through a first node N1, and may output the first input signal to the amplifier circuit 120. The amplifier circuit 120 may amplify the first input signal and may output the amplified first input signal to the second matching circuit 130. The second matching circuit 130 may provide the amplified first input signal to an antenna ANT through a second node N2. The pad Tad' may be a terminal connecting the bidirectional amplifier 100 to a processor (not illustrated). The antenna ANT may be a component for wireless communication between the bidirectional amplifier 100 and an external device (not illustrated). A more detailed description thereof will be described later with reference to FIG. 3A.

In some embodiments, the bidirectional amplifier 100 may operate in a reception mode. The reception mode may be a mode in which a second input signal received from the second matching circuit 130 is amplified and the amplified second input signal is output to the first matching circuit 110. For example, when operating in the reception mode, the second matching circuit 130 may receive a communication signal from the antenna ANT through the second node N2, and may output the second input signal to the amplifier circuit 120. The amplifier circuit 120 may amplify the second input signal and may output the amplified second input signal to the first matching circuit 110. The first matching circuit 110 may provide the amplified second input signal to the pad Tad' through the first node N1. A more detailed description thereof will be described later with reference to FIG. 3B.

The first matching circuit 110 may be connected between the first node N1 and the amplifier circuit 120. The first matching circuit 110 may be connected to the pad Tad' through the first node N1. When the bidirectional amplifier operates in the transmission mode, the first matching circuit 110 may operate as a matching circuit for low noise. When the bidirectional amplifier operates in the reception mode, the first matching circuit 110 may operate as a matching circuit for power amplification.

The amplifier circuit 120 may be connected between the first matching circuit 110 and the second matching circuit 130. The amplifier circuit 120 may include a plurality of transistors.

The second matching circuit 130 may be connected between the second node N2 and the amplifier circuit 120. The second matching circuit 130 may be connected to the antenna ANT through the second node N2. When the bidirectional amplifier operates in the transmission mode, the second matching circuit 130 may operate as a matching circuit for power amplification. When the bidirectional amplifier operates in the reception mode, the second matching circuit 130 may operate as a matching circuit for low noise.

The first bias circuit 140 may control a voltage applied to the first matching circuit 110 depending on a control signal CTR and a complementary control signal /CTR. In some embodiments, the first bias circuit 140 may provide a first bias signal to the first matching circuit 120 in response to the control signal CTR and the complementary control signal /CTR.

For example, during the transmission mode, the first bias circuit 140 may provide a first voltage as the first bias signal to the first matching circuit 110. For example, during the reception mode, the first bias circuit 140 may provide a second voltage as the first bias signal to the first matching circuit 110.

In some embodiments, the first bias circuit 140 may provide a first power supply signal to the first matching circuit 120 in response to the control signal CTR and the complementary control signal /CTR. For example, during the transmission mode, the first bias circuit 140 may provide a ground voltage as the first power supply signal to the first matching circuit 110. During the reception mode, the first bias circuit 140 may provide a first power supply voltage as the first power supply signal to the first matching circuit 110. The first bias circuit 140 may include a first switch and a second switch. A more detailed description thereof will be described later with reference to FIG. 2.

The second bias circuit 150 may control a voltage applied to the second matching circuit 130 depending on the control signal CTR and the complementary control signal /CTR. In some embodiments, the second bias circuit 150 may provide a second bias signal to the second matching circuit 130 in response to the control signal CTR and the complementary control signal /CTR.

For example, during the reception mode, the second bias circuit 150 may provide a first voltage as the second bias signal to the second matching circuit 130. During the transmission mode, the second bias circuit 150 may provide a second voltage as the second bias signal to the second matching circuit 130.

In some embodiments, the second bias circuit 150 may provide a second power supply signal to the second matching circuit 130 in response to the control signal CTR and the complementary control signal /CTR. For example, during the transmission mode, the second bias circuit 150 may provide a power supply voltage as the second power supply signal to the second matching circuit 130. During the reception mode, the second bias circuit 150 may provide the ground voltage as the second power supply signal to the second matching circuit 130. The second bias circuit 150 may include a third switch and a fourth switch. A more detailed description thereof will be described later with reference to FIG. 2.

Figure 2:
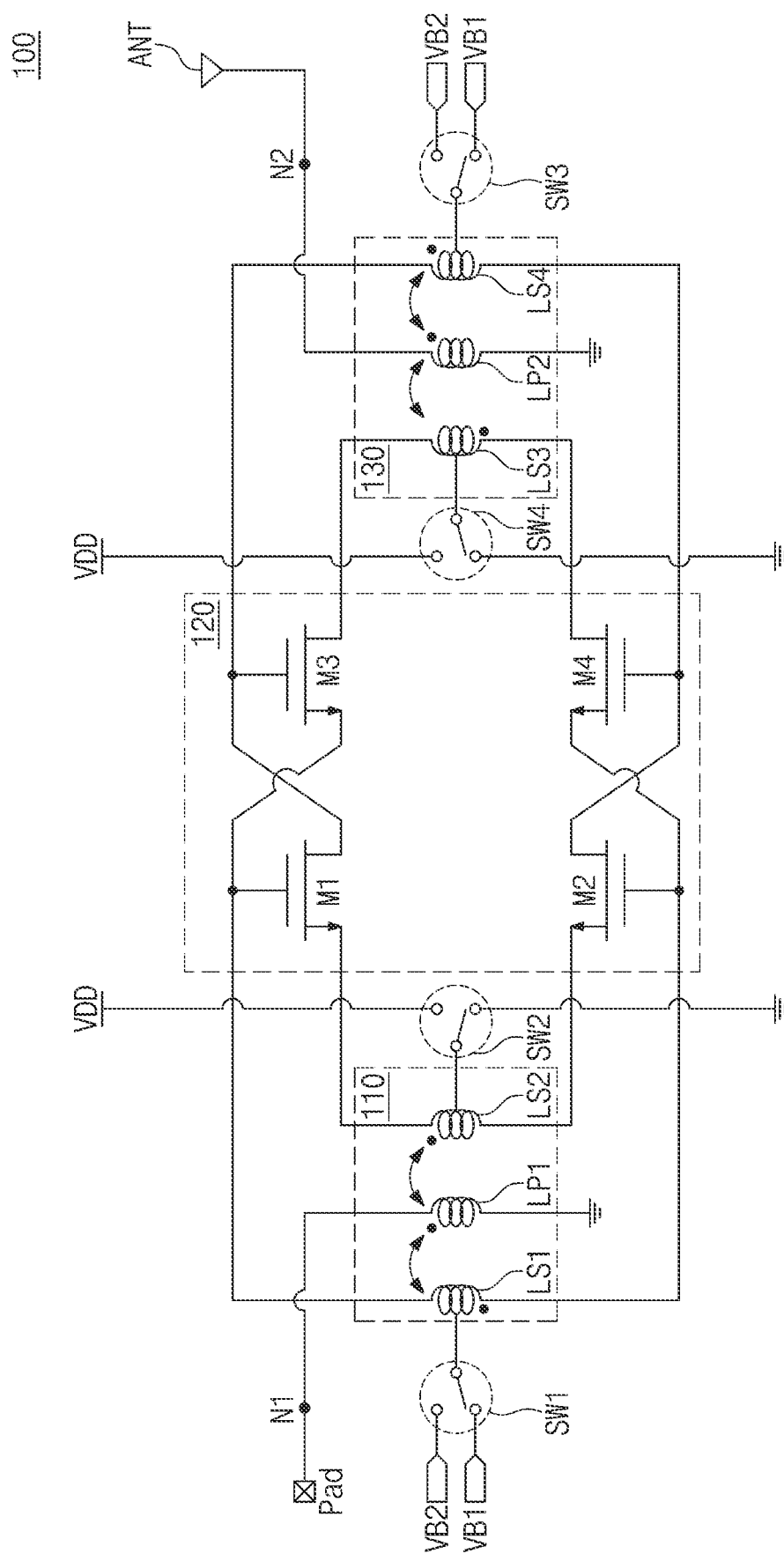
FIG. 2 is a circuit diagram illustrating a bidirectional amplifier of FIG. 1, according to some embodiments of the present disclosure.

FIG. 2 is a circuit diagram illustrating a bidirectional amplifier of FIG. 1, according to some embodiments of the present disclosure. Referring to FIG. 2, the first matching circuit 110, the amplifier circuit 120, and the second matching circuit 130 are illustrated. The first matching circuit 110, the amplifier circuit 120, and the second matching circuit 130 may correspond to the first matching circuit 110, the amplifier circuit 120, and the second matching circuit 130 of FIG. 1, respectively.

The first matching circuit 110 may include a first inductor LS1, a first main inductor LP1, and a second inductor LS2. In some embodiments, the first matching circuit 110 may be a transformer including the first inductor LS1, the first main inductor LP1, and the second inductor LS2. The first matching circuit 110 may be connected to a first switch SW1 and a second switch SW2.

In some embodiments, the first matching circuit 110 includes the first inductor LS1 twisted in a direction different from that of the first main inductor LP1 and the second inductor LS2 twisted in the same direction as that of the first main inductor LP1.

As the first inductor LS1 is twisted in a different direction from the first main inductor LP1, the mutual inductance between the first inductor LS1 and the first main inductor LP1 may have a negative sign. In detail, a direction of a current flowing through the first inductor LS1 may be different from a direction of a current flowing through the first main inductor LP1.

As the second inductor LS2 is twisted in the same direction as that of the first main inductor LP1, the mutual inductance between the second inductor LS2 and the first main inductor LP1 may have a positive sign. In detail, a direction of a current flowing through the second inductor LS2 may be the same as a direction of a current flowing through the first main inductor LP1.

As the first inductor LS1 is twisted in a direction different from that of the first main inductor LP1, and the second inductor LS2 is twisted in the same direction as that of the first main inductor LP1, the mutual inductance between the first inductor LS1 and the second inductor LS2 may have a negative sign.

In some embodiments, unlike to that illustrated in FIG. 2, the first matching circuit 110 may include the first inductor LS1 twisted in the same direction as that of the first main inductor LP1 and the second inductor LS2 twisted in a direction different from that of the first main inductor LP1. As the first inductor LS1 is twisted in the same direction as that of the first main inductor LP1, the mutual inductance between the first inductor LS1 and the first main inductor LP1 may have a positive sign.

As the second inductor LS2 is twisted in a direction different from that of the first main inductor LP1, the mutual inductance between the second inductor LS2 and the first main inductor LP1 may have a negative sign.

As the first inductor LS1 is twisted in the same direction as that of the first main inductor LP1, and the second inductor LS2 is twisted in a direction different from that of the first main inductor LP1, the mutual inductance between the first inductor LS1 and the second inductor LS2 may have a negative sign.

The first inductor LS1 may be connected between a gate node of a first transistor M1 and a gate node of a second transistor M2. The first inductor LS1 may be connected to the first switch SW1. The first main inductor LP1 may be connected between the first node N1 and a ground node providing the ground power. The second inductor LS2 may be connected between a source node of the first transistor M1 and a source node of the second transistor M2. The second inductor LS2 may be connected to the second switch SW2.

The amplifier circuit 120 may include first to fourth transistors M1 to M4. The source node of the first transistor M1 may be connected to a first terminal of the second inductor LS2, a drain node of the first transistor M1 may be connected to a first terminal of a fourth inductor LS4, and the gate node of the first transistor M1 may be connected to a first terminal of the first inductor LS1. Also, the drain node of the first transistor M1 may be connected to a gate node of the third transistor M3.

The source node of the second transistor M2 may be connected to a second terminal of the second inductor LS2, a drain node of the second transistor M2 may be connected to a second terminal of the fourth inductor LS4, and a gate node of the second transistor M2 may be connected to a second terminal of the first inductor LS1. In addition, the gate node of the second transistor M2 may be connected to a gate node of the fourth transistor M4.

A source node of the third transistor M3 may be connected to the first terminal of the first inductor LS1, a drain node of the third transistor M3 may be connected to a first terminal of the third inductor LS3, and the gate node of the third transistor M3 may be connected to the first terminal of the fourth inductor LS4. In addition, the source node of the third transistor M3 may be connected to the gate node of the first transistor M1.

A source node of the fourth transistor M4 may be connected to the second terminal of the first inductor LS1, a drain node of the fourth transistor M4 may be connected to a second terminal of the third inductor LS3, and the gate node of the third transistor M4 may be connected to the second terminal of the fourth inductor LS4. In addition, the source node of the fourth transistor M4 may be connected to the gate node of the second transistor M2. In some embodiments, the first to fourth transistors M1 to M4 may be implemented with NMOS transistors.

The second matching circuit 130 may include a third inductor LS3, a second main inductor LP2, and a fourth inductor LS4. In some embodiments, the second matching circuit 130 may be a transformer including the third inductor LS3, the second main inductor LP2, and the fourth inductor LS4. The second matching circuit 130 may be connected to a third switch SW3 and a fourth switch SW4.

The second matching circuit 130 may have the same structure as the first matching circuit 110. In more detail, similar to how the first matching circuit 110 includes the first inductor LS1 having a negative mutual inductance with respect to the second inductor LS2, the second matching circuit 130 may include the third inductor LS3 having a negative mutual inductance with respect to the fourth inductor LS4.

As the second matching circuit 130 has the same structure as the first matching circuit 110, by controlling only the voltage applied to the first matching circuit 110 and the second matching circuit 130, the bidirectional amplifier 100 may operate in the transmission mode or the reception mode. By avoiding the use of switches in the first matching circuit 110 and the second matching circuit 130, a signal transmission loss may be less when the amplification direction is changed. Accordingly, the amplification operation of the bidirectional amplifier 100 may be improved, and the stability of the amplification operation may be improved. In addition, the bidirectional amplifier 100 may perform an amplification operation with less power.

In some embodiments, as the third inductor LS3 is twisted in a direction different from that of the second main inductor LP2, the mutual inductance between the third inductor LS3 and the second main inductor LP2 may have a negative sign. In detail, a direction of a current flowing through the third inductor LS3 may be different from a direction of a current flowing through the second main inductor LP2.

As the fourth inductor LS4 is twisted in the same direction as that of the second main inductor LP2, the mutual inductance between the fourth inductor LS4 and the second main inductor LP2 may have a positive sign. In detail, a direction of a current flowing through the fourth inductor LS4 may be the same as a direction of a current flowing through the second main inductor LP2.

As the third inductor LS3 is twisted in a direction different from that of the second main inductor LP2, and the fourth inductor LS4 is twisted in the same direction as that of the second main inductor LP2, the mutual inductance between the third inductor LS3 and the fourth inductor LS4 may have a negative sign.

In some embodiments, unlike to that illustrated in FIG. 2, the second matching circuit 130 may include the third inductor LS3 twisted in the same direction as that of the second main inductor LP2 and the fourth inductor LS4 twisted in a direction different from that of the second main inductor LP2. As the third inductor LS3 is twisted in the same direction as that of the second main inductor LP2, the mutual inductance between the third inductor LS3 and the second main inductor LP2 may have a positive sign.

As the fourth inductor LS4 is twisted in a direction different from that of the second main inductor LP2, the mutual inductance between the fourth inductor LS4 and the second main inductor LP2 may have a negative sign.

As the third inductor LS3 is twisted in the same direction as that of the second main inductor LP2, and the fourth inductor LS4 is twisted in a direction different from that of the second main inductor LP2, the mutual inductance between the third inductor LS3 and the fourth inductor LS4 may have a negative sign.

The third inductor LS3 may be connected between the drain node of the third transistor M3 and the drain node of the fourth transistor M4. The third inductor LS3 may be connected to the fourth switch SW4. The second main inductor LP2 may be connected between the second node N2 and the ground node. The fourth inductor LS4 may be connected between the gate node of the third transistor M3 and the gate node of the fourth second transistor M4. The fourth inductor LS4 may be connected to the third switch SW3.

Each of the first switch SW1 and the second switch SW2 may control a voltage applied to the first matching circuit 110, based on the control signal and the complementary control signal. In detail, the first bias circuit of FIG. 1 may include the first switch SW1 and the second switch SW2.

The first switch SW1 may be connected to the first inductor LS1. The first switch SW1 may apply a first voltage VB1 to the first inductor LS1, based on the control signal.

The first switch SW1 may apply a second voltage VB2 to the first inductor LS1, based on the complementary control signal.

As the first switch SW1 applies the first voltage VB1 to the first inductor LS1, the first voltage VB1 may be applied to the gate node of the first transistor M1 and the gate node of the second transistor M2, and the first voltage VB1 may be applied to the source node of the third transistor M3 and the source node of the fourth transistor M4.

As the first switch SW1 applies the second voltage VB2 to the first inductor LS1, the second voltage VB2 may be applied to the gate node of the first transistor M1 and the gate node of the second transistor M2, and the second voltage VB2 may be applied to the source node of the third transistor M3 and the source node of the fourth transistor M4.

The second switch SW2 may apply the ground voltage to the second inductor LS2 based on the control signal. The second switch SW2 may apply a power supply voltage VDD to the second inductor LS2 based on the complementary control signal.

As the second switch SW2 applies the power supply voltage VDD to the second inductor LS2, the power supply voltage VDD may be applied to the source node of the first transistor M1 and the source node of the second transistor M2. As the second switch SW2 applies the ground voltage to the second inductor LS2, the ground voltage may be applied to the source node of the first transistor M1 and the source node of the second transistor M2.

Each of the third switch SW3 and the fourth switch SW4 may control a voltage applied to the second matching circuit 130, based on the control signal and the complementary control signal. In detail, the second bias circuit of FIG. 1 may include the third switch SW3 and the fourth switch SW4.

The third switch SW3 may be connected to the fourth inductor LS4. The third switch SW3 may apply the first voltage VB1 to the fourth inductor LS4, based on the control signal. The third switch SW3 may apply the second voltage VB2 to the fourth inductor LS4, based on the complementary control signal.

As the third switch SW3 applies the first voltage VB1 to the fourth inductor LS4, the first voltage VB1 may be applied to the gate node of the third transistor M3 and the gate node of the fourth transistor M4, and the first voltage VB1 may be applied to the drain node of the first transistor M1 and the drain node of the second transistor M2.

As the third switch SW3 applies the second voltage VB2 to the fourth inductor LS4, the first voltage VB2 may be applied to the gate node of the third transistor M3 and the gate node of the fourth transistor M4, and the second voltage VB2 may be applied to the drain node of the first transistor M1 and the drain node of the second transistor M2.

The fourth switch SW4 may be connected to the third inductor LS3. The fourth switch SW4 may apply the ground voltage to the third inductor LS3 based on the control signal. The fourth switch SW4 may apply the power supply voltage VDD to the third inductor LS3 based on the complementary control signal.

As the fourth switch SW4 applies the ground voltage to the third inductor LS3, the ground voltage may be applied to the drain node of the third transistor M3 and the drain node of the fourth transistor M4. As the fourth switch SW4 applies the power supply voltage to the third inductor LS3, the power supply voltage may be applied to the drain node of the third transistor M3 and the drain node of the fourth transistor M4.

Figure 3A:
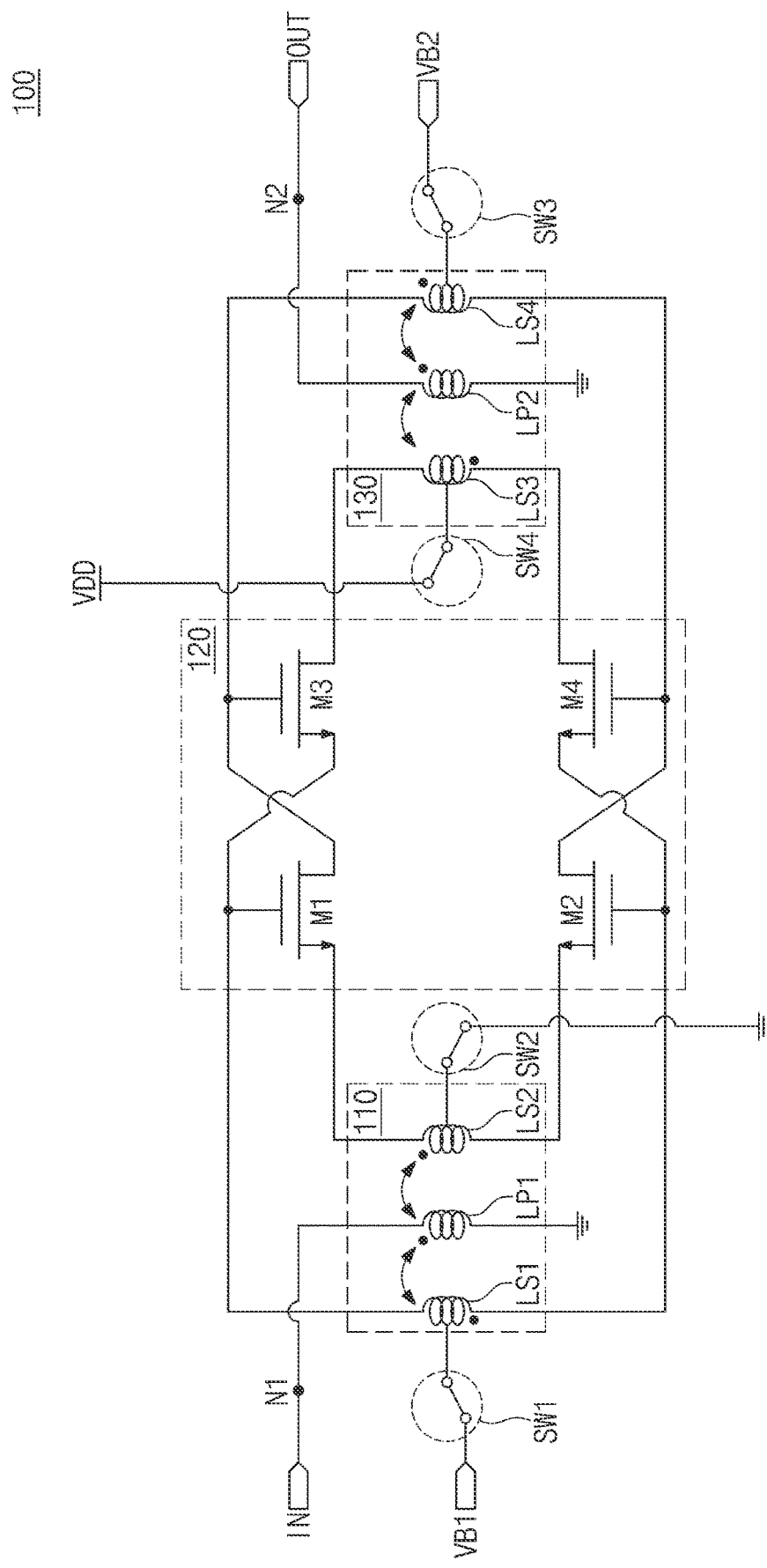
FIG. 3A is a circuit diagram illustrating a bidirectional amplifier of FIG. 2, according to some embodiments of the present disclosure.

FIG. 3A is a circuit diagram illustrating a bidirectional amplifier of FIG. 2, according to some embodiments of the present disclosure. Referring to FIG. 3A, the bidirectional amplifier 100 operating in the transmission mode is illustrated.

When operating in the transmission mode, the first switch SW1 may apply the first voltage VB1 to the first inductor LS1 based on the control signal, and the second switch SW2 may apply the ground voltage to the second inductor LS2 based on the control signal. The third switch SW3 may apply the second voltage VB2 to the fourth inductor LS4 based on the complementary control signal, and the fourth switch SW4 may apply the power supply voltage VDD to the third inductor LS3 based on the complementary control signal. As described above, the first switch SW1 and the third switch SW3 may apply voltages complementary to each other, and the second switch SW2 and the fourth switch SW4 may operate complementary to each other.

The first matching circuit 110 may receive an operation signal IN from the first node N1. Since the first inductor LS1 is twisted in a direction different from that of the second inductor LS2, a signal of the source node of the first transistor M1 has a phase difference of 180 degrees from a signal of the gate node of the first transistor M1. Accordingly, a voltage swing of the source node of the first transistor M1 and a voltage swing of the gate node of the first transistor M1 increase, and an increased transconductance may be obtained.

In addition, since the first inductor LS1 is twisted in a direction different from that of the second inductor LS2, a signal of the source node of the second transistor M2 has a phase difference of 180 degrees from a signal of the gate node of the second transistor M2. Accordingly, a voltage swing of the source node of the second transistor M2 and a voltage swing of the gate node of the second transistor M2 increase, and an increased transconductance may be obtained. Accordingly, when the operation signal IN is received, the first matching circuit 110 may operate as a matching circuit for low noise.

The second matching circuit 130 may output an amplified first input signal OUT to the second node N2. When the third inductor LS3 and the fourth inductor LS4 receive signals having an opposite phase to each other, as the third inductor LS3 is twisted in a direction different from that of the fourth inductor LS4, the third inductor LS3 and the fourth inductor LS4 may increase magnetic fluxes to each other. Accordingly, when the amplified first input signal OUT is output, the second matching circuit 130 may operate as a matching circuit for power amplification.

Figure 3B:
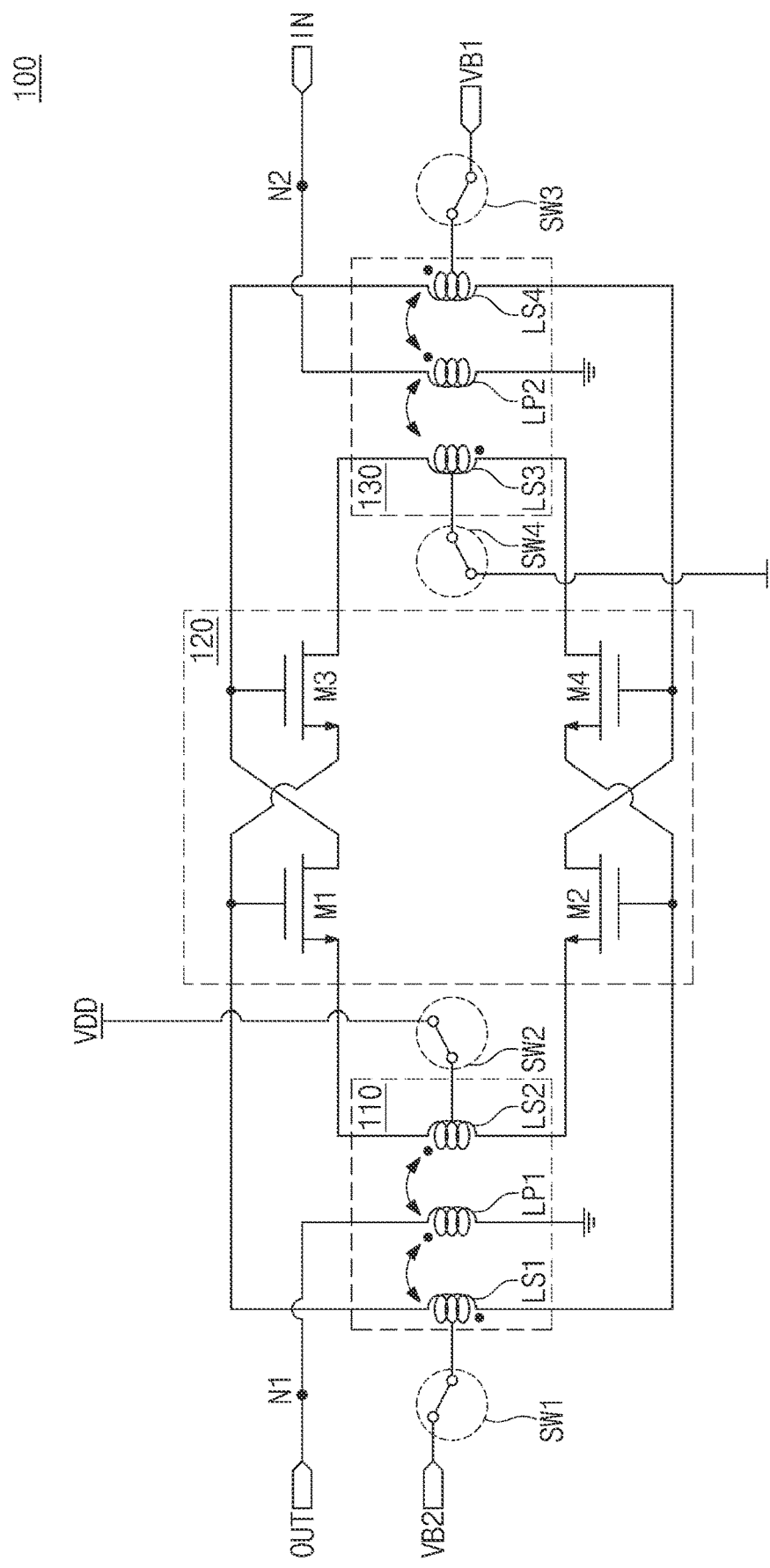
FIG. 3B is a circuit diagram illustrating a bidirectional amplifier of FIG. 2, according to some embodiments of the present disclosure.

FIG. 3B is a circuit diagram illustrating a bidirectional amplifier of FIG. 2, according to some embodiments of the present disclosure. Referring to FIG. 3B, the bidirectional amplifier 100 operating in the reception mode is illustrated.

When operating in the reception mode, the first switch SW1 may apply the second voltage VB2 to the first inductor LS1 based on the complementary control signal, and the second switch SW2 may apply the power supply voltage to the second inductor LS2 based on the complementary control signal. The third switch SW3 may apply the first voltage VB1 to the fourth inductor LS4 based on the control signal, and the fourth switch SW4 may apply the ground voltage to the third inductor LS3 based on the control signal.

The second matching circuit 130 may receive the communication signal IN from the second node N2. Since the third inductor LS3 is twisted in a direction different from that of the fourth inductor LS4, a signal of the source node of the third transistor M3 has a phase difference of 180 degrees from a signal of the gate node of the third transistor M3. Accordingly, a voltage swing of the source node of the third transistor M3 and a voltage swing of the gate node of the third transistor M3 increase, and an increased transconductance may be obtained.

In addition, since the third inductor LS3 is twisted in a direction different from that of the fourth inductor LS4, a signal of the source node of the fourth transistor M4 has a phase difference of 180 degrees from a signal of the gate node of the fourth transistor M4. Accordingly, a voltage swing of the source node of the fourth transistor M4 and a voltage swing of the gate node of the fourth transistor M4 increase, and an increased transconductance may be obtained. Accordingly, when the communication signal IN is received, the second matching circuit 130 may operate as a matching circuit for low noise.

The first matching circuit 110 may output an amplified second input signal OUT to the first node N1. As the first inductor LS1 is twisted in a direction different from that of the second inductor LS2, the first inductor LS1 and the second inductor LS2 may increase magnetic fluxes to each other. Accordingly, when the amplified second input signal OUT is output, the first matching circuit 110 may operate as a matching circuit for power amplification.

Figure 4:
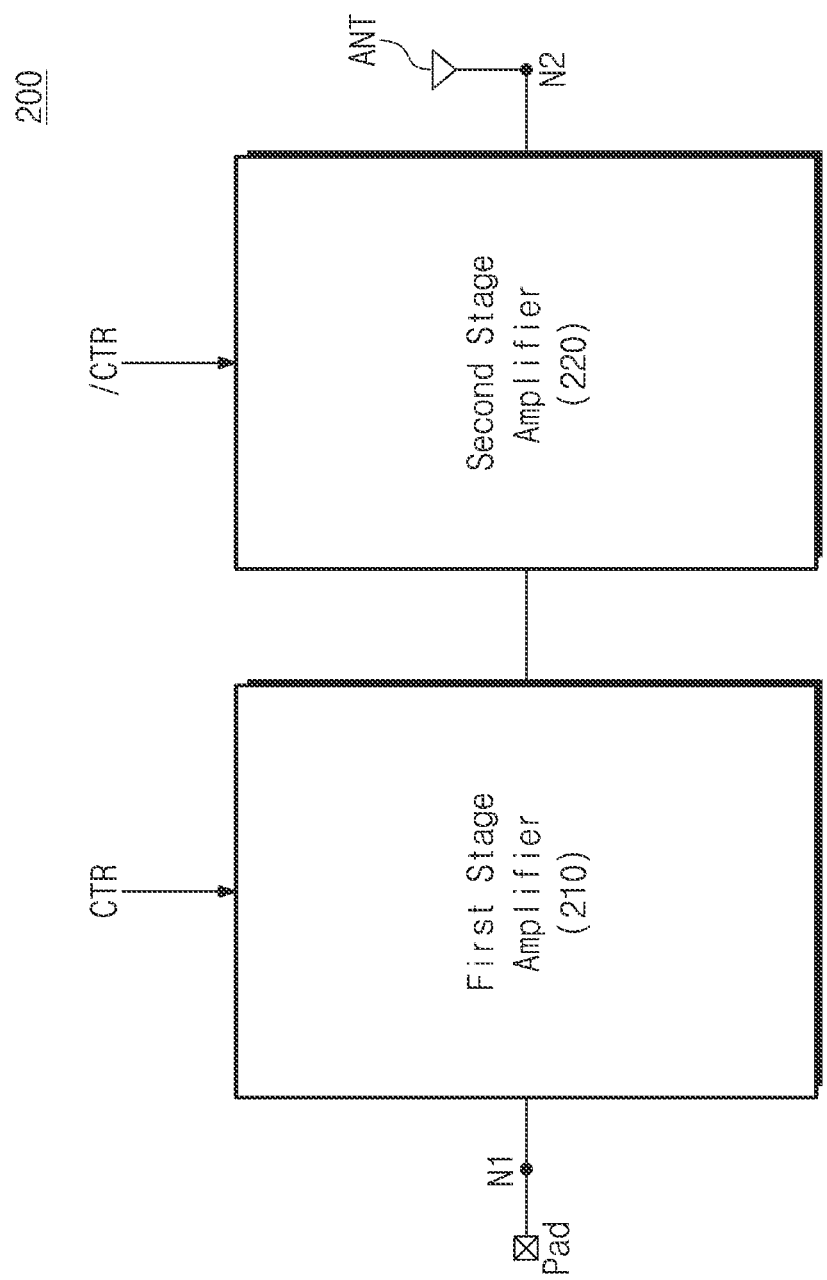
FIG. 4 is a block diagram of a bidirectional amplifier, according to an embodiment of the present disclosure.

FIG. 4 is a block diagram of a bidirectional amplifier, according to an embodiment of the present disclosure. Referring to FIG. 4, a bidirectional amplifier 200 may include a first stage amplifier 210 and a second stage amplifier 220. The bidirectional amplifier 200 of FIG. 4 may correspond to the bidirectional amplifier 100 of FIG. 1. A detailed description thereof will be omitted to avoid redundancy.

In some embodiments, the bidirectional amplifier 200 may operate in the transmission mode. The transmission mode may be a mode in which the first input signal received from the first stage amplifier 210 is amplified and the amplified first input signal is output to the second stage amplifier 220.

In some embodiments, the bidirectional amplifier 200 may operate in the reception mode. The reception mode may be a mode in which the second input signal received from the second stage amplifier 220 is amplified and the amplified second input signal is output to the first stage amplifier 210.

The first stage amplifier 210 may be connected between the first node N1 and the second stage amplifier 220. The first stage amplifier 210 may include a plurality of inductors. The first stage amplifier 210 may control voltages applied to the plurality of inductors, based on the control signal CTR and the complementary control signal /CTR.

The second stage amplifier 220 may be connected between the second node N2 and the first stage amplifier 210. The second stage amplifier 220 may include a plurality of inductors. The second stage amplifier 220 may control voltages applied to the plurality of inductors, based on the control signal CTR and the complementary control signal /CTR.

Figure 5:
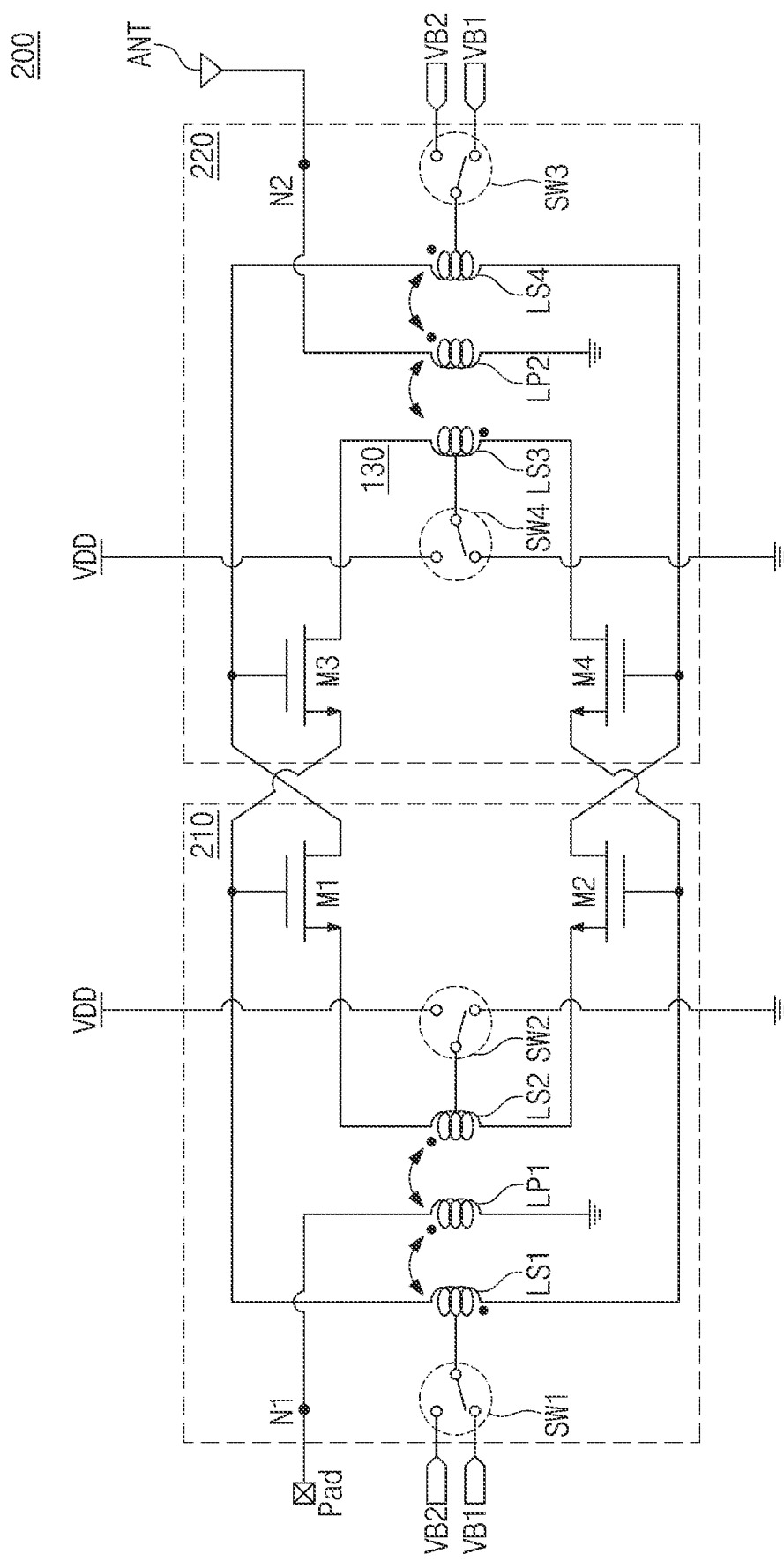
FIG. 5 is a circuit diagram illustrating a bidirectional amplifier of FIG. 4, according to some embodiments of the present disclosure.

FIG. 5 is a circuit diagram illustrating a bidirectional amplifier of FIG. 4, according to some embodiments of the present disclosure. Referring to FIG. 5, the bidirectional amplifier 200 may include the first stage amplifier 210 and the second stage amplifier 220.

The first stage amplifier 210 may include the first inductor LS1, the first main inductor LP1, the second inductor LS2, the first transistor M1, the second transistor M2, the first switch SW1, and the second switch SW2.

The first inductor LS1 may be connected between the gate node of a first transistor M1 and the gate node of a second transistor M2. The first inductor LS1 may be connected to the first switch SW1. The first main inductor LP1 may be connected between the first node N1 and a ground node providing ground power. The second inductor LS2 may be connected between the source node of the first transistor M1 and the source node of the second transistor M2. The second inductor LS2 may be connected to the second switch SW2.

As the first inductor LS1 is twisted in a different direction from the first main inductor LP1, the mutual inductance between the first inductor LS1 and the first main inductor LP1 may have a negative sign. In detail, a direction of a current flowing through the first inductor LS1 may be different from a direction of a current flowing through the first main inductor LP1.

As the second inductor LS2 is twisted in the same direction as that of the first main inductor LP1, the mutual inductance between the second inductor LS2 and the first main inductor LP1 may have a positive sign. In detail, a direction of a current flowing through the second inductor LS2 may be the same as a direction of a current flowing through the first main inductor LP1.

In some embodiments, the first inductor LS1, the first main inductor LP1, and the second inductor LS2 may be implemented with a transformer.

The source node of the first transistor M1 may be connected to a first terminal of the second inductor LS2, the drain node of the first transistor M1 may be connected to a first terminal of the fourth inductor LS4, and the gate node of the first transistor M1 may be connected to a first terminal of the first inductor LS1. Also, the drain node of the first transistor M1 may be connected to a gate node of the third transistor M3.

The source node of the second transistor M2 may be connected to the second terminal of the second inductor LS2, the drain node of the second transistor M2 may be connected to the second terminal of the fourth inductor LS4, and the gate node of the second transistor M2 may be connected to the second terminal of the first inductor LS1. In addition, the gate node of the second transistor M2 may be connected to the gate node of the fourth transistor M4.

The first switch SW1 may be connected to the first inductor LS1. The first switch SW1 may apply the first voltage VB1 to the first inductor LS1, based on the control signal. The first switch SW1 may apply the second voltage VB2 to the first inductor LS1, based on the complementary control signal.

The second switch SW2 may apply the ground voltage to the second inductor LS2, based on the control signal. The second switch SW2 may apply the power supply voltage VDD to the second inductor LS2 based on the complementary control signal.

The second stage amplifier 220 may include the third inductor LS3, the second main inductor LP2, the fourth inductor LS4, the third transistor M3, the fourth transistor M4, the third switch SW3, and the fourth switch SW4.

The third inductor LS3 may be connected between the drain node of the third transistor M3 and the drain node of the fourth transistor M4. The third inductor LS3 may be connected to the fourth switch SW4. The second main inductor LP2 may be connected between the second node N2 and the ground node. The fourth inductor LS4 may be connected between the gate node of the third transistor M3 and the gate node of the fourth second transistor M4. The fourth inductor LS4 may be connected to the third switch SW3.

As the third inductor LS3 is twisted in a direction different from that of the second main inductor LP2, the mutual inductance between the third inductor LS3 and the second main inductor LP2 may have a negative sign. In detail, a direction of a current flowing through the third inductor LS3 may be different from a direction of a current flowing through the second main inductor LP2.

As the fourth inductor LS4 is twisted in the same direction as that of the second main inductor LP2, the mutual inductance between the fourth inductor LS4 and the second main inductor LP2 may have a positive sign. In detail, a direction of a current flowing through the fourth inductor LS4 may be the same as a direction of a current flowing through the second main inductor LP2.

In some embodiments, the third inductor LS3, the second main inductor LP2, and the fourth inductor LS4 may be implemented with a transformer.

A source node of the third transistor M3 may be connected to the first terminal of the first inductor LS1, a drain node of the third transistor M3 may be connected to a first terminal of the third inductor LS3, and the gate node of the third transistor M3 may be connected to the first terminal of the fourth inductor LS4. In addition, the source node of the third transistor M3 may be connected to the gate node of the first transistor M1.

A source node of the fourth transistor M4 may be connected to the second terminal of the first inductor LS1, a drain node of the fourth transistor M4 may be connected to a second terminal of the third inductor LS3, and the gate node of the third transistor M4 may be connected to the second terminal of the fourth inductor LS4. In addition, the source node of the fourth transistor M4 may be connected to the gate node of the second transistor M2.

The third switch SW3 may be connected to the fourth inductor LS4. The third switch SW3 may apply the first voltage VB1 to the fourth inductor LS4, based on the control signal. The third switch SW3 may apply the second voltage VB2 to the fourth inductor LS4, based on the complementary control signal.

The fourth switch SW4 may be connected to the third inductor LS3. The fourth switch SW4 may apply the ground voltage to the third inductor LS3 based on the control signal. The fourth switch SW4 may apply the power supply voltage VDD to the third inductor LS3 based on the complementary control signal.

The second stage amplifier 220 may include a transformer having the same structure as the first stage amplifier 210. In more detail, similar to how the first stage amplifier 210 includes the first inductor LS1 twisted in a direction different from that of the first main inductor LP1 and the second inductor LS2 twisted in the same direction as that of the first main inductor LP1, the second stage amplifier 220 may include the third inductor LS3 twisted in a direction different from that of the second main inductor LP2 and the fourth inductor LS4 twisted in the same direction as that of the second main inductor LP2.

Figure 6:
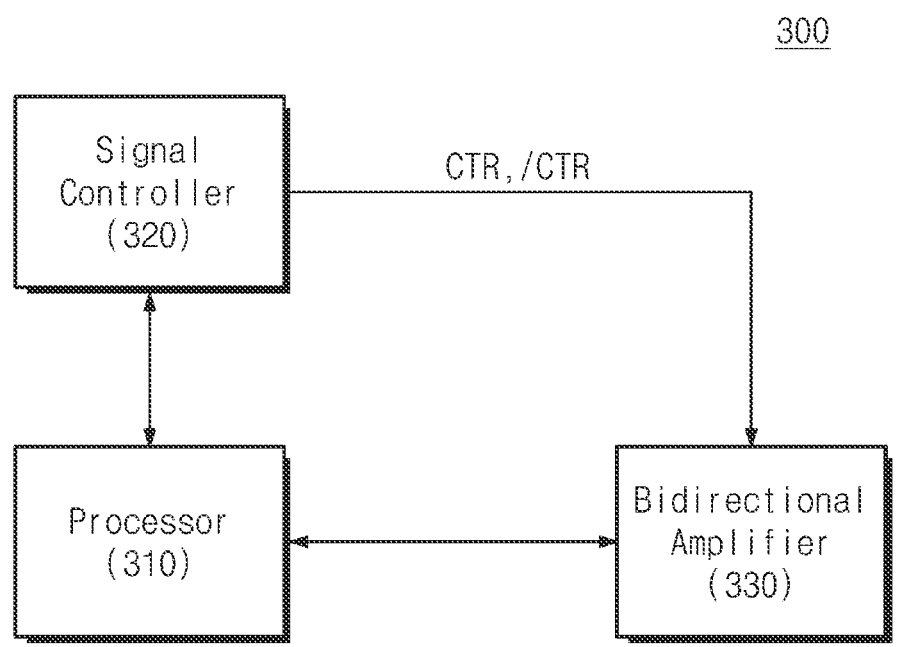
FIG. 6 is a block diagram illustrating a communication device, according to an embodiment of the present disclosure.

FIG. 6 is a block diagram illustrating a communication device, according to an embodiment of the present disclosure. Referring to FIG. 6, a communication device 300 may include a processor 310, a signal controller 320, and a bidirectional amplifier 330. The bidirectional amplifier 330 may correspond to the bidirectional amplifier 100 of FIG. 1. A detailed description thereof will be omitted to avoid redundancy.

The processor 310 may process a baseband signal to generate an operation signal for transmission to the bidirectional amplifier 330, and may perform baseband signal processing on the communication signal received through the bidirectional amplifier 330. For example, the processor 310 may be a central processing unit (CPU) and a graphics processing unit (GPU).

The signal controller 320 may generate the control signal CTR and the complementary control signal /CTR under the control of the processor 310. In more detail, the signal controller 320 may provide the control signal CTR to the first bias circuit of the bidirectional amplifier, and may provide the complementary control signal /CTR to the second bias circuit of the bidirectional amplifier, during the transmission mode under the control of the processor 310. During the reception mode, the complementary control signal /CTR may be provided to the first bias circuit of the bidirectional amplifier and the control signal CTR may be provided to the second bias circuit.

According to an embodiment of the present disclosure, a bidirectional amplifier including matching circuits composed of inductors and a communication device including the same are provided.

As the bidirectional amplifier includes the same matching circuit at both terminals regardless of the amplification direction, the bidirectional amplifier capable of stably amplifying a signal and operating with less power and the communication device including the same are provided.

The above description refers to embodiments for implementing the present disclosure. Embodiments in which a design is changed simply or which are easily changed may be included in the present disclosure as well as an embodiment described above. In addition, technologies that are easily changed and implemented by using the above embodiments may be included in the present disclosure. While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A bidirectional amplifier comprising:
   a first matching circuit;
   a second matching circuit; and
   an amplifier circuit connected between the first matching circuit and the second matching circuit, configured to amplify a first input signal received from the first matching circuit to output the amplified first input signal to the second matching circuit, and configured to amplify a second input signal received from the second matching circuit to output the amplified second input signal to the first matching circuit,
   wherein the first and second matching circuits have a symmetrical structure and operate complementarily to each other;
   wherein the amplifier circuit includes:
   a first transistor;
   a second transistor;
   a third transistor having a gate node connected to a drain node of the first transistor and having a source node connected to a gate node of the first transistor; and
   a fourth transistor having a gate node connected to a drain node of the second transistor and having a source node connected to a gate node of the second transistor, and
   wherein the first matching circuit includes:
   a first main inductor connected between a first node and a ground node providing a ground power;
   a first inductor connected between the gate node of the first transistor and the gate node of the second transistor; and a second inductor connected between a source node of the first transistor and a source node of the second transistor, and wherein the second matching circuit includes:
a second main inductor connected between a second node and the ground node;
a third inductor connected between a drain node of the third transistor and a drain node of the fourth transistor; and
a fourth inductor connected between the gate node of the third transistor and the gate node of the fourth transistor.

2. The bidirectional amplifier of claim 1, wherein the first inductor has a negative mutual inductance with respect to the second inductor, and
wherein the third inductor has a negative mutual inductance with respect to the fourth inductor.

3. The bidirectional amplifier of claim 1, further comprising:
a first bias circuit configured to provide a first bias signal to the first inductor and to provide a first power supply signal to the second inductor; and
a second bias circuit configured to provide a second bias signal to the third inductor and to provide a second power supply signal to the fourth inductor.

4. The bidirectional amplifier of claim 3, wherein the first bias circuit includes:
a first switch configured to provide a first bias voltage as the first bias signal during a first mode; and
a second switch configured to provide a ground voltage as the first power supply signal during the first mode, and
wherein the second bias circuit includes:
a third switch configured to provide a second bias voltage as the second bias signal during the first mode; and
a fourth switch configured to provide a power supply voltage as the second power supply signal during the first mode.

5. The bidirectional amplifier of claim 4, wherein the first mode is a mode for amplifying the first input signal received from the first matching circuit and outputting the amplified first input signal to the second matching circuit.

6. The bidirectional amplifier of claim 3, wherein the first bias circuit includes:
a first switch configured to provide a second bias voltage as the first bias signal during a second mode; and
a second switch configured to provide a power supply voltage as the first power supply signal during the second mode, and
wherein the second bias circuit includes:
a third switch configured to provide a first bias voltage as the second bias signal during the second mode; and
a fourth switch configured to provide a ground voltage as the second power supply signal during the second mode.

7. The bidirectional amplifier of claim 6, wherein the second mode is a mode for amplifying the second input signal received from the second matching circuit and outputting the amplified second input signal to the first matching circuit.

8. The bidirectional amplifier of claim 1, wherein the first matching circuit is configured to generate the first input signal based on an operation signal received from a processor, and configured to provide the second input signal amplified by the amplifier circuit to the processor; and
the second matching circuit is configured to generate the second input signal based on a communication signal received from an antenna, and configured to provide the first input signal amplified by the amplifier circuit to the antenna.

9. A communication device comprising:
a processor;
a signal controller configured to generate a control signal and a complementary control signal under a control of the processor; and
a bidirectional amplifier configured to communicate with the processor and the signal controller, and
wherein the bidirectional amplifier includes:
a first matching circuit;
a second matching circuit; and
an amplifier circuit connected between the first matching circuit and the second matching circuit, configured to amplify a first input signal received from the first matching circuit to output the amplified first input signal to the second matching circuit, and configured to amplify a second input signal received from the second matching circuit to output the amplified second input signal to the first matching circuit,
wherein the first and second matching circuits have a symmetrical structure and operate complementarily to each other;
wherein the amplifier circuit includes:
a first transistor;
a first transistor;
a third transistor having a gate node connected to a drain node of the first transistor and having a source node connected to a gate node of the first transistor; and
a fourth transistor having a gate node connected to a drain node of the second transistor and having a source node connected to a gate node of the second transistor, and
wherein the first matching circuit includes:
a first main inductor connected between the first node and a ground node providing a ground power;
a first inductor connected between the gate node of the first transistor and the gate node of the second transistor; and
a second inductor connected between a source node of the first transistor and a source node of the second transistor,
wherein the second matching circuit includes:
a second main inductor connected between a second node and the ground node;
a third inductor connected between a drain node of the third transistor and a drain node of the fourth transistor; and
a fourth inductor connected between the gate node of the third transistor and the gate node of the fourth transistor.

10. The communication device of claim 9, further comprising:
a first bias circuit configured to provide a first bias signal to the first inductor and to provide a first power supply signal to the second inductor; and
a second bias circuit configured to provide a second bias signal to the third inductor and to provide a second power supply signal to the fourth inductor.

11. The communication device of claim 10, wherein the signal controller under the control of the processor is further configured to:
provide a control signal to the first bias circuit and provide a complementary control signal to the second bias circuit, during the first mode; and provide the complementary control signal to the first bias circuit and provide the control signal to the second bias circuit, during a second mode different from the first mode.

12. The communication device of claim 11, wherein the first mode is a mode for amplifying the first input signal received from the first matching circuit and outputting the amplified first input signal to the second matching circuit, and wherein the second mode is a mode for amplifying the second input signal received from the second matching circuit and outputting the amplified second input signal to the first matching circuit.

* * * * *